United States Patent [19]

Small et al.

[11] 4,166,253

[45] Aug. 28, 1979

[54] HETEROSTRUCTURE DIODE INJECTION LASER HAVING A CONSTRICTED ACTIVE REGION

[75] Inventors: Martin B. Small, Mohegan Lake; Peter S. Zory, Jr., Ossining, both of N.Y.

[73] Assignee: International Business Machines Corporation, Armonk, N.Y.

[21] Appl. No.: 824,690

[22] Filed: Aug. 15, 1977

[51] Int. Cl.² ............................................. H01S 3/19
[52] U.S. Cl. ................................. 331/94.5 H; 357/18
[58] Field of Search ................... 331/94.5 H; 357/17, 357/18

[56] References Cited

U.S. PATENT DOCUMENTS

| | | | |
|---|---|---|---|
| 3,978,428 | 8/1976 | Burnham et al. | 331/94.5 H |
| 4,011,113 | 3/1977 | Thompson et al. | 331/94.5 H X |

OTHER PUBLICATIONS

Aiki, et al., "Channeled-Substrate Planar Structure (AlGa)As Injection Lasers," *Applied Physics Letters*, vol. 30, No. 12, Jun. 15, 1977, pp. 649-651.

Kirkby, et al., "Channeled Substrate Buried Heterostructure GaAs-(GaAl)As Injection Lasers," *J. of Applied Physics*, vol. 47, No. 10, Oct. 1976, pp. 4578-4589.

*Primary Examiner*—James W. Davie
*Attorney, Agent, or Firm*—Ronald L. Drumheller

[57] ABSTRACT

In a heterostructure diode injection laser, the active layer has a region of relatively lesser thickness in registration with a stripe geometry contact. Increased gain within the region of lesser thickness relative to adjacent regions of greater thickness tends to effectively confine lasing operation to the thinner or constricted region. The dimensions of the constricted active region may be readily selected to discriminate against multifilament lasing modes in order to produce a single spot laser beam over a wide range of injection levels.

8 Claims, 4 Drawing Figures

HETEROSTRUCTURE DIODE INJECTION LASER HAVING A CONSTRICTED ACTIVE REGION

BACKGROUND OF THE INVENTION

1. Field of the Invention

This invention relates to waveguide lasers and, more particularly, to double heterostructure diode lasers constrained to lase in a single filament mode.

2. Description of the Prior Art

For many diode laser applications a single spot laser beam is very desirable. Preferably, the width and height dimensions of the spot should be as nearly equal as possible, the divergence as low as possible, the power as high as possible, and the spatial location as stable as possible. What is desired in theory is single filament lasing at all injection levels up to the catastrophic failure level. However, while a diode laser normally begins lasing at threshold in a single filament or spot, the tendency at higher pump current levels is for the single filament to break up into a multifilament configuration. No distinction will be made herein between multimode lasing configurations and a single higher order mode lasing configuration, since both have effectively more than one lasing filament and therefore both may be considered multifilament lasing configurations. "Single filament" herein implies a single lasing mode with a generally elliptical transverse intensity distribution which resembles the fundamental transverse mode of a two-dimensional dielectric waveguide. Prior art structures for single filament lasing typically have been unsuccessful at high injection levels, with the more successfully operating structures being the most difficult to fabricate in general.

Conventional prior art double heterostructure (DH) diode lasers normally have carrier and optical confinement only in the direction perpendicular to the p-n junction (hereinafter called the transverse direction). The lasing mode is thereby controlled in the transverse direction (hereinafter called the transverse lasing mode), but not in the direction parallel to the junction (hereinafter called the lateral direction). As a result, more than one lasing filament ordinarily occurs as soon as the injection level is raised substantially above threshold.

Conventional stripe geometry DH lasers provide some control of the lasing mode in the lateral direction (hereinafter called the lateral lasing mode) by controlling the lateral current distribution and therefore the lateral gain distribution with the stripe electrode. However, a minimum width for the stripe electrode is established by heat dissipation requirements. The current spreads over a still wider area before it reaches the active layer resulting in a lateral gain distribution which is still too wide to produce single filament operation except at current levels close to threshold.

In U.S. Pat. No. 3,883,821, the active layer in a stripe geometry DH laser is given a rib configuration, which results in an optical confinement effect in the lateral direction which, it is predicted, will produce single filament operation. Both optical and carrier confinement in the lateral direction occur in the buried heterostructure laser described by T. Tsukada in the Journal of Applied Physics, Vol. 45, No. 11, (November 1974) at pages 4899–4906 and entitled "GaAs-Ga$_{1-x}$Al$_x$As Buried-Heterostructure Injection Laser." Single filament operation again occurs because the transverse and lateral modes are confined within a region of suitably small geometry. However, fabrication of both of these structures requires at least two separate epitaxy growth steps separated by at least one etching step. As a practical matter, this produces a growth interface having detrimental effects.

Devices which may be fabricated using a substantially continuous epitaxial deposition have a clear fabrication advantage and avoid detrimental epitaxy interface problems. One such device is disclosed in an article entitled "Single Mode Operation of GaAs-GaAlAs TJS-Laser Diodes" published by H. Namizaki in the Transactions of the IECE of Japan, Vol. E59, No. 5 (May 1976) at pages 8–15. However, the disclosed device suffers from the disadvantage that there is a zinc diffusion, which in practice is difficult to control to the degree required. Zinc diffused GaAs is also known to have a tendency toward developing crystal defects.

In U.S. Pat. No. 3,978,428 a continuous epitaxial process is used to produce the active and confining layers in an etched groove. Optical confinement in the lateral direction occurs because the active region becomes thinner in the lateral direction. The stripe contact and the diffused layer at the shoulders of the groove also act to control the lateral current and thereby gain distribution. In practice, however, the diffused layer at the shoulders tends to short circuit the active region because the lower confining layer at the shoulders becomes too thin. If the lower confining layer is made thicker at the shoulders, then the groove tends to be filled in so much by this layer that device performance suffers for other reasons.

In the article entitled "Improved Light-output Linearity in Stripe-Geometry Double-Heterostructure (Al,Ga)As Lasers," Applied Physics Letters, Vol. 29, No. 6 (September 1976) at pages 372–374, Dixon, et al, describe a stripe having a reduced width. The region outside the desired active area is also proton bombarded ("proton-delineated" stripe region) so that the current which laterally spreads into the bombarded region does not produce any effective minority carriers, thereby controlling the gain distribution in the lateral direction. As reported in this article, single filament lasing results from this configuration over an improved current range, but high current operation still results in a multifilament configuration.

In an article entitled, "Channeled-Substrate Planar Structure (AlGa)As Injection Lasers," Applied Physics Letters, Vol. 30, No. 12 (June 1977), Aiki, et al, describe a structure in which the lateral active regions are effectively made more lossy in order to create an effective reduction in index of refraction in the lateral directions. The resulting effective optical confinement controls the lateral mode, but only at moderate injection levels.

OBJECTS OF THE INVENTION

It is an object of the invention to provide an improved laser.

A further object is to provide an improved double heterojunction diode laser.

Still another object of this invention is to provide a diode laser which produces spatially stable single filament lasing over a wide range of injection levels.

It is also an object to provide an easily fabricated diode laser having spatially stable single filament lasing over a wide range of injection levels.

Yet another object of this invention is to provide a diode laser having spatially stable single filament lasing over a wide range of injection levels which may be fabricated by uninterrupted epitaxial deposition.

The foregoing and other objects, features and advantages of the invention will be apparent from the following more particular description of a preferred embodiment of the invention.

SUMMARY OF THE INVENTION

In accordance with an illustrative embodiment of the invention in a double heterostructure junction laser, a semiconductor body comprises a first active layer having an elongate constricted region, second and third confinement layers disposed on opposite sides of the first layer and in integral contact therewith, the second and third layers having a wider bandgap than the first layer so as to confine minority carriers within the first layer, a p-n junction substantially parallel with and disposed sufficiently close to the first layer to inject minority carriers into the first layer when forward biased and means for forward biasing the p-n junction over a region at least coextensive with the constricted region, the dimensions of the constricted region being effective to constrain the laser to single filament operation when the p-n junction is forward biased. In particular, spatially stable single filament lasing is achieved over a wide range of injection levels of a stripe geometry DH laser by controlling the lateral mode operation parallel to the junction with a constriction in the active layer in registration with the stripe contact. The dimensions of the constriction are chosen to produce single filament lasing. The structure may be fabricated by uninterrupted liquid phase epitaxy on a grooved substrate.

DESCRIPTION OF THE PREFERRED EMBODIMENT

Figure 1:
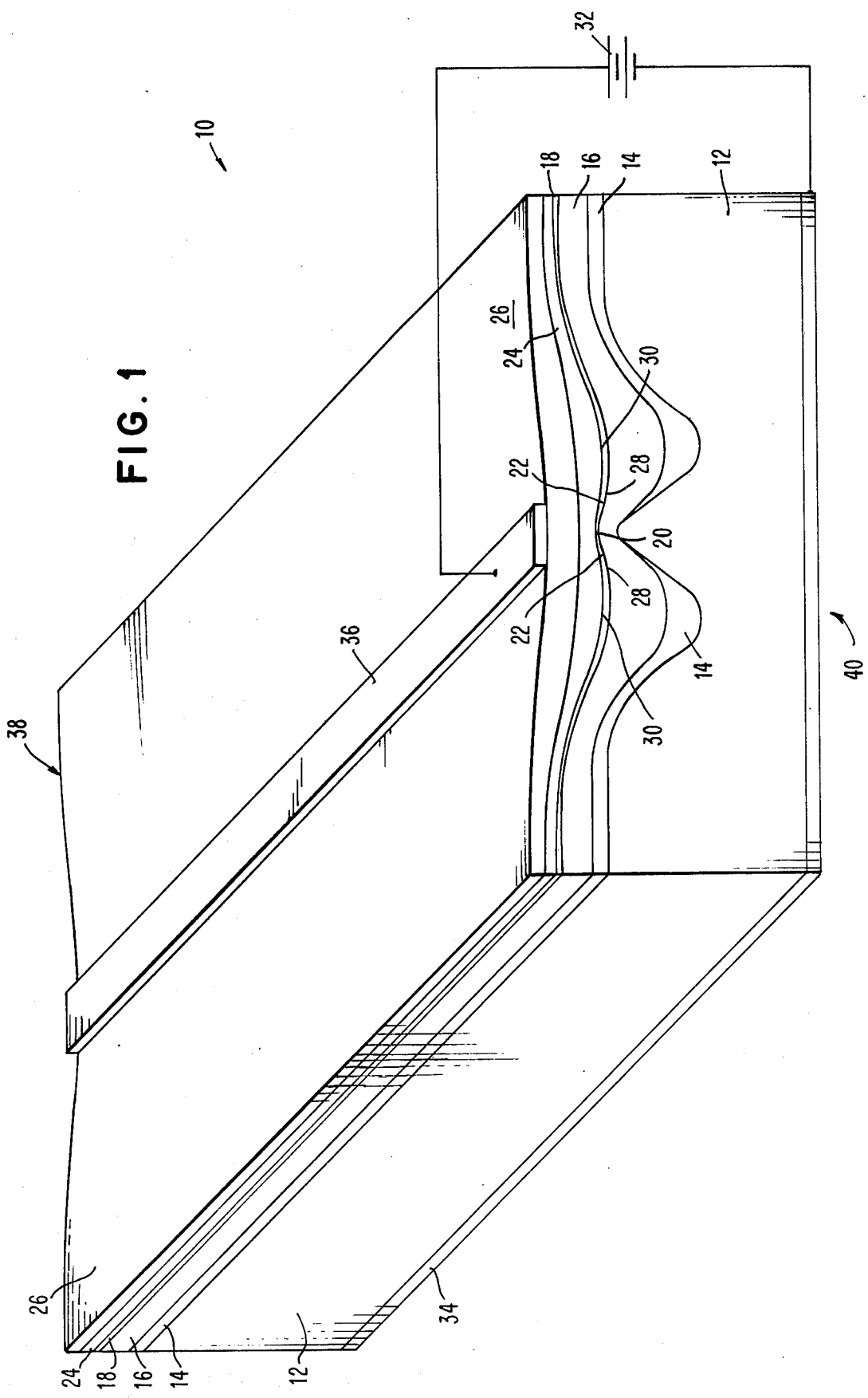
FIG. 1 is a schematic drawing of a double heterostructure laser having a constricted active region in accordance with a preferred embodiment of this invention.

Turning now to FIG. 1, there is shown a double heterostructure junction laser 10 in accordance with the present invention. For simplicity and in order to facilitate explanation, FIG. 1 has not been drawn to scale. Laser 10 includes a substrate 12, an optional current control layer 14, a first carrier confining and light wave guiding layer 16, an active layer 18 having a constricted active region 20 and adjacent thicker active regions 22, a second carrier confining and light wave guiding layer 24, and an optional contacting layer 26.

The interfaces between layers 18 and layers 16 and 24 form heterojunctions 28 and 30, respectively, which act to confine carriers within the layer 18. In order to so confine carriers, the bandgap of the material of layer 18 must be lower than the bandgaps of the materials of layers 16 and 24 at the heterojunctions. As will soon become more apparent, carrier confinement itself causes a gain discontinuity which tends to guide light waves. Layer 18 preferably also has an index of refraction higher than the indexes of refraction of the materials of layers 16 and 24 in order to also directly confine light waves within the layer 18. Such refractive index light guiding may be alternatively accomplished at a separate interface of two different material sublayers within layer 16 and/or 24 rather than at the heterojunctions themselves, as will be readily appreciated. Layers 16 and 24 are generally of opposite conductivity type, whereas active layer 18 may be n-type, p-type, both, compensated, or undoped. A p-n junction (not shown) is located either within layer 18 or sufficiently close to one of the heterojunctions 28 or 30 to inject minority carriers into layer 18 when forward biased. The p-n junction is generally substantially parallel with one of the heterojunctions 28 or 30 and normally is coincident with one of the heterojunctions. The p-n junction is forward biased by means of a source 32 connected between a contact 34 on substrate 12 and a contact 36 on the contacting layer 26. Contact 36 may be formed directly onto layer 24, thereby eliminating layer 26, if the materials of contact 36 and layer 24 adhere and form a suitably low resistance interface therebetween.

Pump current flow is preferably concentrated through the constricted region 20 in order to inject relatively more minority carriers into the constricted region than into adjacent regions 22. Such current concentration improves device performance but is not required with a suitable constriction because what is actually required is a suitable carrier density gradient or profile in the lateral direction, which may be produced by the constriction alone without superposing also a current density gradient or profile in the lateral direction, as will soon become more apparent. In FIG. 1, pump current is concentrated by the combined effect of the limited width of electrode 36 and the discontinuity in layer 14. The finite width of the stripe geometry contact 36 tends to reduce the lateral spreading of current and thereby tends to limit the region of the p-n junction which is substantially forward biased. Layers 14 and 16 are of opposite conductivity type for the same purpose. When the p-n junction at layer 18 is forward biased, the interface between layers 14 and 16 (which is also a p-n junction) will be reverse biased. Thus, the current tends to be funneled toward the central region where layer 14 is discontinuous and the reverse biased junction is accordingly absent. This central region where layer 14 is absent as well as the stripe contact 36 are both in registration with the constricted region 20 to concentrate current flow through the constricted region 20.

Layer 18 forms the active layer of the laser in which minority carriers injected by the forward biased p-n junction recombine with majority carriers and produce light waves. Recombination is concentrated in the constricted region 20 by the constriction itself and by current concentration if it is present. End faces 38 and 40 are reflective to form an optical cavity resonator for sustaining the light generated in the active layer. At least one of the end faces is partly transmissive so as to allow some of the light energy to escape as an output beam. End faces 38, 40 are generally cleaved facets parallel to each other and perpendicular to the axial direction of the constricted region 20.

Figure 2:
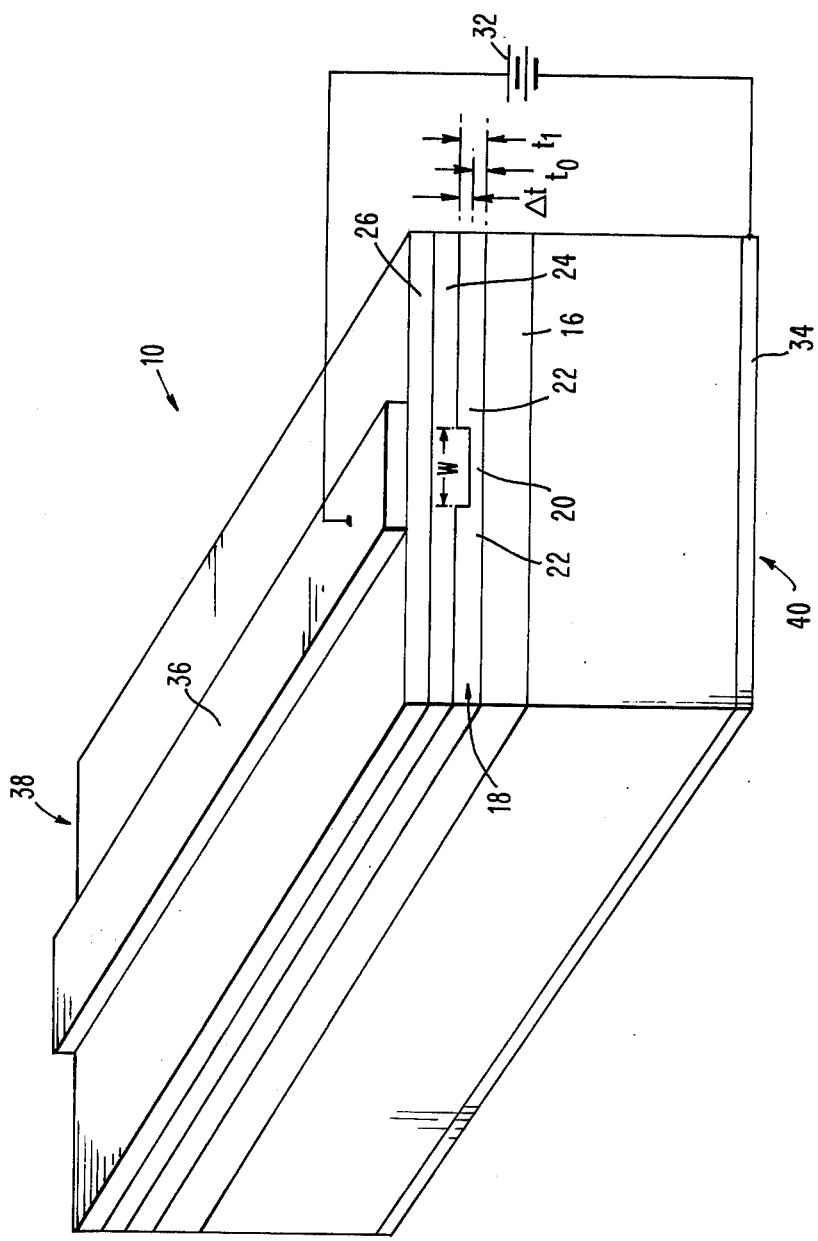
FIG. 2 is a schematic drawing of another double heterostructure laser having a constricted active region which is rectangular in order to facilitate explanation of the operational principles of this invention.

FIG. 2 is another embodiment of the present invention. From a fabrication viewpoint, this structure is more difficult to make with current technology because, unlike the structure of FIG. 1, the structure of FIG. 2 cannot readily be fabricated using uninterrupted epitaxial deposition techniques. It might be constructed, however, utilizing an intermediate material removal step such as, for example, taught in U.S. Pat. No. 3,859,178. From an operational viewpoint, the structure of FIG. 2 may be superior because the constriction in the active region is more pronounced. In any event, the rectangular geometry of the active layer facilitates explanation of the operational principles of the present invention. For this reason, FIG. 2 may be viewed as a schematic representation of the structure of FIG. 1 with layer 14 removed. Electrode 36 has been shown as a stripe geometry contact consistent with FIG. 1. Device performance is improved thereby because current flow is not wasted through regions of no interest outside of the constriction area. Current concentration is not required for mode confinement and is not assumed in subsequent computation.

Active layer 18 of FIG. 2 includes a constricted active region 20 of uniform width w and uniform thickness $t_o$ extending between two mirror faces 38, 40. Adjacent to the constricted active region 20 are thicker active regions 22 of uniform thickness $t_1$. The step change in active layer 18 thickness between these regions is thus $\Delta t = t_1 - t_o$.

Using known techniques for solving the boundary value problem associated with this structure, it is possible to calculate dimensions $t_o$, w and $\Delta t$ which will result in single filament operation over a broad pump current range. Basically, design parameters are selected which will assure that the transverse and lateral mode gains are considerably larger for the fundamental mode than for any other mode. It is important that these gains for the fundamental mode be considerably larger than for any other mode because of the distorting effect the lasing mode has on the spatial distribution of gain. What seems to happen as the injection level rises is that the gain increases in active regions outside of the lasing filament while the integrated gain within the lasing region tends to remain the same due to the lasing conversion of excess minority carriers into light energy. This changes the gain distribution in a direction such that it ordinarily tends to become more suitable for a multifilament lasing configuration. However, changing to a new lasing configuration results in a consequential changing of the gain distribution in a direction, it seems, which makes the new lasing configuration less suitable again. Thus, the transition to a new lasing configuration occurs gradually over a range of injection levels in which the mode configuration is unstable. In order to avoid this region of instability where gain distortions caused by the single active filament induce simultaneous lasing also of higher order modes to some extent, the transverse and lateral mode gains for the fundamental mode must be considerably larger than for higher order modes. The size of the difference in gain will determine to some extent the range of injection levels over which single filament lasing will occur.

For the purpose of calculating mode gains, the structure of FIG. 2 may be viewed as a waveguide of rectangular dimensions w and $t_o$. In the transverse direction (the direction perpendicular to the layers), waveguiding occurs due to the difference in refractive index between the active layer 18 and the confining layers 16 and 24. In the lateral direction (the direction parallel to the layers) waveguiding occurs due to the difference in gain (minority carrier concentration) between the constricted region 20 and the thicker regions 22. There is a difference in gain between region 20 and regions 22 even without any concentration of pump current because even when minority carriers are uniformly injected into the active layer by a uniform current distribution, the concentration of minority carriers in the constricted region is higher due to the smaller thickness of the active layer in this region. An antiwaveguiding effect also occurs in the lateral direction due to an effective increase in refractive index resulting from the change in thickness. These waveguiding effects (refractive index guiding or antiguiding and gain guiding) may be considered the real and imaginary parts of a complex index of refraction. The mathematics of calculating boundary value waveguiding problems involving complex indices of refraction are developed, for example, in Reisinger, "Characteristics of Optical Guided Modes in Lossy Waveguides," Applied Optics, Vol. 12, pages 1015–1025 (1973), which is herein incorporated by reference.

For example, it will be assumed that the active layer 18 is GaAs having a real component of refractive index equal to 3.59 and layers 16 and 24 are $Al_xGa_{1-x}As$ having a real component of refractive index equal to 3.45, 3.38 or 3.32 corresponding respectively to x values of 0.2, 0.3, and 0.4. It will be further assumed that current is driven through the device of FIG. 2 in the forward bias direction and is uniform over the constricted region 20 and over adjacent thicker regions 22. The gain in the active layer 18 may then be expressed as $$g(t) = B(n_i j / t) - A$$

where B and A are quantities characteristic of the GaAs active layer, $n_i$ is the internal quantum efficiency, j is the current density, and t is the thickness of the active layer. A typical value for $n_i j$ for room temperature continuous operation is 1.6 kA/cm$^2$, which is the value here assumed for the purpose of computation. It should be understood, however, that increasing or decreasing this value will in general move the resulting gain curves upward or downward respectively. The gain function may be converted to an imaginary refractive index function $K(t) = g(t)\lambda/4\pi$, where $\lambda$ is the wavelength in vacuum of the light emitted by the active layer, which is about 0.882 $\mu$m for this GaAs system. Thus, the complex refractive index of the active layer of thickness t is $3.59 + iK(t) = 3.59 + ig(t)\lambda/4\pi$. Using this value and the real refractive indices 3.45, 3.38, and 3.32 mentioned above, the transverse mode gains for various order modes and various thicknesses may be calculated using the mathematics set forth in the referenced article.

Figure 3:
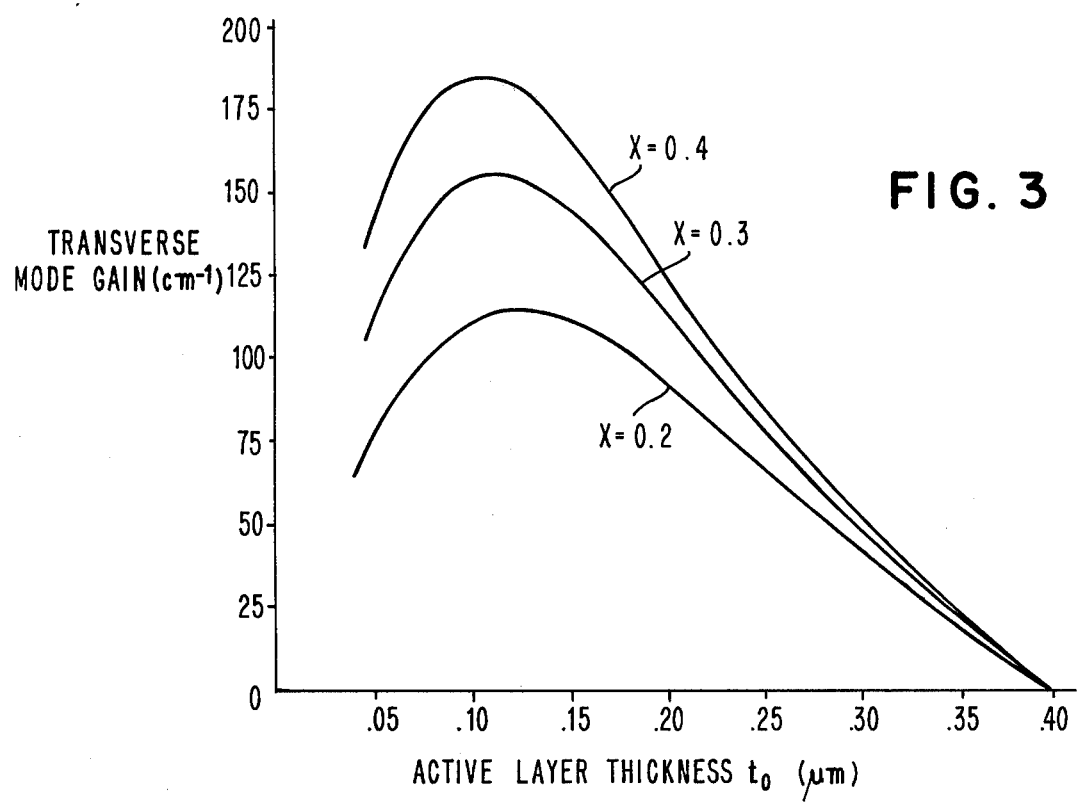
FIG. 3 is a graph which shows how the fundamental transverse mode gain varies with active region thickness for various refractive index differences in the structure of FIG. 2.

Plotted in FIG. 3 are the computed results obtained for the fundamental transverse electric mode, $TE_o$, over a typical range of active layer thicknesses for this (AlGa)As system. All higher order transverse modes ($TE_1$, $TE_2$, etc.) either did not exist or had mode gains far smaller than the $TE_o$ mode and need not be considered further. As t is reduced, the mode gain first increases due to the increasing gain in the active layer resulting from the reduced thickness and then decreases due to decreasing modal electric field overlap with the gain region. For low current density operation, it is obvious that a thickness corresponding to the peak gain or a thickness close thereto should be selected. In general, however, and particularly where the active region thickness changes only gradually, such as in FIG. 1, the minimum thickness in the constricted region should also not be less than the thickness corresponding to the peak gain. Otherwise, there might be two spatially separated areas within the constricted region each having maximum modal gain. This might tend to favor a multifilament lasing configuration. Structural configurations are probably possible, however, where the double peaking of maximum gain does not occur even though the minimum thickness within the constricted region is less than the minimum value predicted by FIG. 3. This may occur for example, with some nonuniform current distributions or where the constriction is unduly sharp. In general, however, FIG. 3 predicts that the constriction in an (AlGa)As system should have a minimum thickness within a range of about 0.05 to about 0.40 μm, and preferably within the range of about 0.10 to about 0.20 μm. Since thicknesses of this order are difficult to control accurately, a design minimum thickness within the constriction of about 0.15 μm would seem to be appropriate and is accordingly preferred for an (AlGa)As system. These computations can be made for other laser material systems, but it may be easier to determine experimentally the optimum thickness of the constriction.

Figure 4:
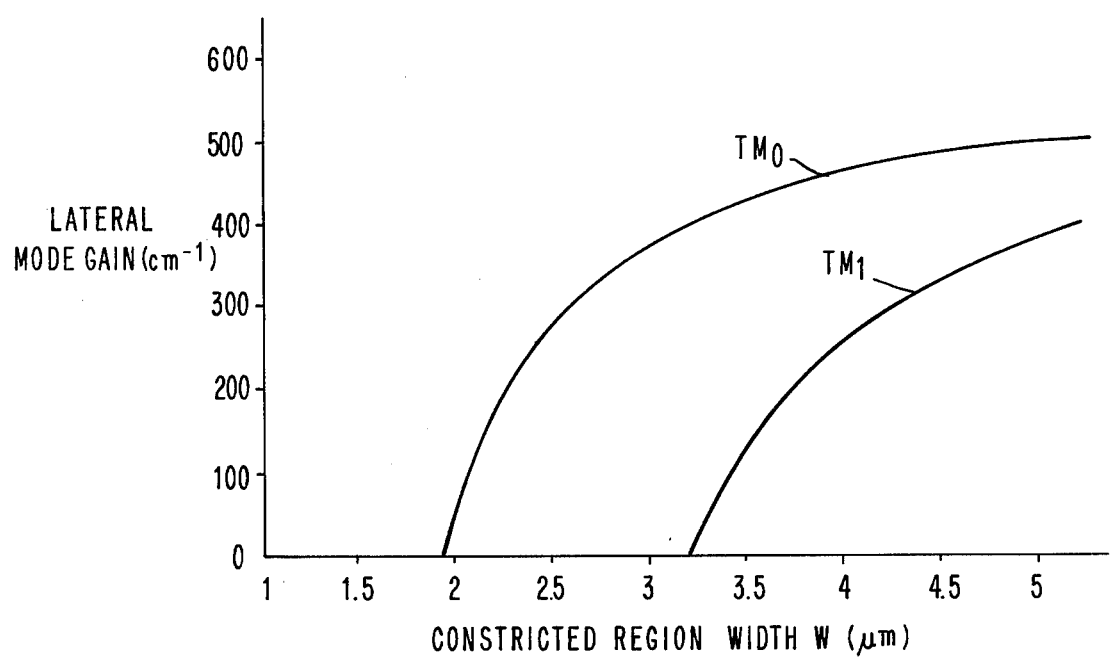
FIG. 4 is a graph which shows how the fundamental and first order lateral mode gains vary with the active region width in the structure of FIG. 2.

In the above computation of transverse mode gain, the modal properties were determined primarily by the real part of the index difference between the active and confining layers. The imaginary part of the index difference caused by the gain discontinuity between the active and confining layers was not significant in comparison with the real part of the index difference. In the lateral direction, the modal properties are determined primarily by the imaginary part of the index difference between the constricted region 20 and thicker regions 22 ($K(t_o)-K(t_1)$). However, because the regions are of different thickness, an additional index factor enters into the computation. Essentially, light in region 20 behaves as if regions 22 have a higher real refractive index than region 20. Consequently, the lateral mode computation proceeds as if the region 20 of width w has refractive index $3.59+iK(t_o)$ and the regions 22 have refractive index $(3.59+\Delta n)+iK(t_1)$ where $\Delta n$ is positive and may be estimated by known techniques. For example, if $\Delta t = t_1 - t_o = 0.15$ μm $-0.10$ μm $= 0.05$ μm, then $\Delta n$ is approximately 0.027. Using this value in the above index formula and K values at $t_o = 0.10$ μm and $t_1 = 0.15$ μm for the x=0.3 case shown in FIG. 3, the fundamental and first order transverse magnetic mode gains were calculated using again the mathematical techniques described in the referenced article. It was assumed that the magnetic vector of the lateral mode is perpendicular to the heterojunctions in FIG. 2 in order to be consistent with the choice made in the transverse mode calculation of the electric vector being parallel to the heterojunctions. In FIG. 4, the results of the calculation are plotted for the fundamental transverse magnetic mode $TM_o$ and the next higher order mode $TM_1$. The main feature of interest is the rapid increase in the difference between the plotted curves as the width w decreases below 5 μm. As explained previously, the fundamental mode gain must be considerably larger than the mode gain of any other mode for single filament lasing over a wide range of injection levels. From FIG. 4, it is clear that very large lateral mode gain differences can be achieved by making w sufficiently small. As shown in FIG. 4, the first order mode gain drops to zero at the chosen injection level at effective constriction widths less than 3.2 μm. The actual value chosen for w cannot be arbitrarily small, however, because the low fundamental mode gains associated with small values of w imply higher threshold current densities. For an (AlGa)As system, FIG. 4 suggests that the effective width w must be greater than about 2.0 μm and perhaps should be within a range of about 2.5 to 5.0 μm. An effective width of about 3.5 μm would seem to be preferred for a system of this type.

The operational characteristics of the tapered active region in the device of FIG. 1 may be calculated in similar fashion, but a detailed calculation would be exceedingly complex. Experimental determination of optimum geometrical parameters ordinarily would be more practical and may be easily accomplished.

The laser of FIG. 1 is preferably fabricated from the (AlGa)As system in which, for example, the layers may be the following: an n-GaAs substrate, a p-(AlGa)As current control layer 14, and n-(AlGa)As first confining and guiding layer 16, a p-(AlGa)As active layer 18, a p-(AlGa)As second confining and guiding layer 24, and a p-GaAs contacting layer 26, in which the concentration of aluminum in layer 18 is less than the concentrations of aluminum in layers 16 and 24, which concentrations need not be equal.

This structure may be formed by a process which requires only a single uninterrupted epitaxial growth step, which may be liquid phase epitaxial growth. The substrate 12 is prepared by etching at least one groove therein to form an elongate convex surface. In FIG. 1 a substrate is illustrated with two adjacent grooves in order to form a sharply raised convex central ridge. It is also possible to use a shoulder of a single groove as the elongate convex surface in analogous fashion. The disadvantage in this case is that the resulting layer structure about the constricted active region is tilted with respect to the contacts. The layers also may be deposited over a step-like discontinunity with the same disadvantage.

The shape of the constricted region 20 is controlled in part by the shape of the first confining and guiding layer 16 over which it is deposited. The shape of layer 16 in turn is controlled in part by the shape of the structure on which it is deposited. The shapes of these layers are also controlled by the tendency of atoms to attach themselves more readily to a surface having less convex curvature. At equilibrium between the solid surface and the solution from which it is grown, energy is minimized if the surface is planar. Growth is a nonequilibrium process. By modulation of the growth rate, it is possible to control the curvature of the growing surfaces. During the growth of layer 14, the convexity of the central ridge on the original surface may be so great that dissolution rather than growth takes place at the top of the ridge. Discontinuous layer 14 may be formed in this fashion. If the growth rate is then relatively great during the growth of layer 16 the convexity of the underlying surface may be preserved. A reduction in the growth rate during the growth of layer 18 causes the convexity of the growing surface to be reduced because the situation is now closer to equilibrium. In this way, the necessary constriction region 20 may be created.

References which accidentally describe in more detail the epitaxial growth of constricted active regions, the teachings of which are accordingly incorporated herein by reference, are: U.S. Pat. No. 3,978,428; Botz, et al, "Growth Characteristics of GaAs-Ga$_{1-x}$Al$_x$As Structures Fabricated by Liquid-Phase Epitaxy Over Preferentially Etched Channels," Applied Physics Letters, Vol. 28, No. 4 (February 1976) at pages 234–237; and Kirkby, et al, "Channeled Substrate Buried Heterostructures GaAs-(GaAl)As Injection Lasers," Jour. of Applied Physics, Vol. 47, No. 10 (October 1976) at pages 4578–4589.

While the invention has been particularly shown and described with reference to the preferred embodiment thereof, it will be understood by those skilled in the art that the foregoing and other changes in form and details may be made therein without departing from the spirit and scope of the invention.

What is claimed is:

1. Heterostructure junction laser, comprising:
a first active layer having an elongate constricted region;
second and third confinement layers disposed on opposite sides of said first layer and in integral contact therewith,
said second and third layers having a wider bandgap than said first layer;
a p-n junction substantially parallel with said first layer and disposed so as to inject minority carriers into said first layer when forward biased;
contact means for forward biasing said p-n junction over at least a part of said constricted region of said first layer; and
first and second reflective faces at opposite ends of said elongate constricted region, said faces being parallel to one another and oriented perpendicular to the axial direction of said elongate constricted region;
the dimensions of said constricted region being effective to constrain the laser to single filament operation when said p-n junction is forward biased.

2. A laser as defined in claim 1 wherein said p-n junction is substantially coincident with an interface between said first layer and one of said confinement layers.

3. A laser as defined in claim 1 wherein said contact means includes a stripe geometry contact in registration with said constricted region.

4. A laser as defined in claim 1 wherein said first, second and third layers comprise (AlGa)As, the aluminum fraction in said first layer being less than the aluminum fractions in said second and third layers.

5. A laser as defined in claim 1 wherein said constricted region has a minimum thickness between 0.05 $\mu$m and 0.40 $\mu$m.

6. A laser as defined in claim 5 wherein said constricted region has a width of between 2.5 $\mu$m and 5.0 $\mu$m.

7. A laser as defined in claim 1 wherein said first, second and third layers are grown by uninterrupted liquid phase epitaxial deposition.

8. A laser as defined in claim 7 wherein said layers are grown over a double grooved substrate having a central convex ridge.

* * * * *